US009031262B2

(12) United States Patent
Silfvast et al.

(10) Patent No.: US 9,031,262 B2
(45) Date of Patent: May 12, 2015

(54) DISTRIBUTED, SELF-SCALING, NETWORK-BASED ARCHITECTURE FOR SOUND REINFORCEMENT, MIXING, AND MONITORING

(75) Inventors: Robert D. Silfvast, Belmont, CA (US); Raymond Tantzen, Pacifica, CA (US)

(73) Assignee: Avid Technology, Inc., Burlington, MA (US)

( * ) Notice: Subject to any disclaimer, the term of this patent is extended or adjusted under 35 U.S.C. 154(b) by 292 days.

(21) Appl. No.: 13/602,433

(22) Filed: Sep. 4, 2012

(65) Prior Publication Data

US 2014/0064519 A1 Mar. 6, 2014

(51) Int. Cl.
*H04B 1/00* (2006.01)
*H04H 60/04* (2008.01)
*H03G 5/00* (2006.01)

(52) U.S. Cl.
CPC .................................... *H04H 60/04* (2013.01)

(58) Field of Classification Search
CPC .................................................. H04R 2420/01
USPC ................................................... 381/119, 98
See application file for complete search history.

(56) References Cited

U.S. PATENT DOCUMENTS

| | | | | |
|---|---|---|---|---|
| 7,774,520 | B2 * | 8/2010 | Hanebutte et al. | 710/52 |
| 8,098,851 | B2 | 1/2012 | von Heydekampf et al. | |
| 8,385,566 | B2 | 2/2013 | von Heydekampf et al. | |
| 2008/0219478 | A1 * | 9/2008 | Aoki et al. | 381/119 |
| 2012/0300960 | A1 * | 11/2012 | Mackay et al. | 381/119 |

OTHER PUBLICATIONS myMix, Personal Monitor Mixing and Multitrack Recording System, Data Sheet, Jun. 2012, 2 pages.
myMix Control, Data Sheet, Jun. 2012, 2 pages.

* cited by examiner

*Primary Examiner* — Paul S Kim
*Assistant Examiner* — Norman Yu
(74) *Attorney, Agent, or Firm* — Oliver Strimpel

(57) ABSTRACT

A distributed self-scaling network audio processing system includes end nodes interconnected by packet-switched network and operating as peers on the network. Each of the end nodes supports local input processing, mixing, and output processing. The input processing includes the option of dual input channels for supporting separate front-of-house and monitor workflows. End nodes are added to the system to support specific audio processing applications, based on the number of audio sources, the number of output mixes required, and the number of locations from which users choose to interact with the system.

26 Claims, 10 Drawing Sheets

DISTRIBUTED, SELF-SCALING, NETWORK-BASED ARCHITECTURE FOR SOUND REINFORCEMENT, MIXING, AND MONITORING

BACKGROUND

In professional audio, a mixing console, or audio mixer, also called a sound board, mixing desk, or mixer, is an electronic device for combining (also called mixing), routing, and changing the level, timbre and/or dynamics of audio signals. A mixer can mix analog or digital signals or both, depending on the type of mixer. The modified signals (voltages or digital samples) are summed to produce the combined output signals.

Mixing consoles are used in many applications, including recording studios, public address systems, sound reinforcement systems, broadcasting, television, and film post-production. An example of a simple application would be to enable the signals that originated from two separate microphones (each being used by vocalists singing a duet, perhaps) to be heard though one set of speakers simultaneously. When used for live performances, the signal produced by the mixer will usually be sent directly to an amplifier, unless that particular mixer is "powered" or it is being connected to powered speakers.

The output of a mixer is referred to as a mix bus or simply a bus. As used herein, the term "mix bus" refers to an audio signal produced by combining multiple audio source signals in a weighted summation operation where typically the individual weights applied to each source signal are under user control for example using the linear faders or knobs of a mixing console). The term "mix matrix" is used to refer to an operation that produces multiple mix busses from a common group of audio source signals. At any instant in time, this operation can be mathematically represented by the matrix equation $C=B*A$, where C is a vector of N output signal states, A is a vector of M input signal states, and B is an M-by-N rectangular matrix of summing weights, and the * is a matrix multiplication operator. In some cases a mix, bus might be a single discrete audio channel, while in other cases it may include more than one audio channel having a common association (for example, a stereo mix bus has two channels left and right, and a surround mix bus has more than two channels corresponding to the surround speaker configuration targeted by the particular mix).

In common practice, the mixing console serves as a central "hub" in the audio system, allowing for all of the audio source signals in a given application to be acquired, treated, combined into various mixes, and then re-distributed outward to monitoring equipment (loudspeakers and headphones) or recording equipment (tape decks or hard disk recorders) or broadcast feeds (satellite uplinks, webcasts, other remote feeds) from a central point in the system. The use of this centralized architecture has been necessary in designing analog mixing consoles, because these devices employ analog circuitry that is physically attached to the various control knobs, switches, faders (rheostats), and LED indicators. In order for a single person to operate all the controls of the system in an ergonomically convenient manner, all of these analog circuits needed to be located underneath, or behind, a common physical control panel. With the penetration of digital technology into mixing console design, some equipment makers have chosen to physically separate the user interface controls from the audio processing hardware elements; however the audio signal flow architecture has remained essentially the same, with the mixer being the center of the audio system.

Audio systems are not always built around one single mixer. In fact, it is common practice to use multiple mixers in a given application to perform sub-mixing. In this model, the mixing (combining) of audio signals occurs in a hierarchical fashion, with groups of signals being pre-mixed in one mixer, and the result of that pre-mix being fed into another mixer where it is combined with other individual signals or other pre-mixes coming from other sub-mixers. In a live concert application, it is common practice to separate the "front-of-house" mixing task from the "on-stage monitoring" mixing task using two separate mixing consoles each having its own operator. In this model, each source signal is split into two feeds (often using a device called a "splitter snake" which performs this function for many sources); one feeding each of the front-of-house and on-stage monitoring mixers. The front-of-house operator creates the audience mix, while the monitor mix operator creates mixes for the performers on stage to hear themselves and their co-performers as clearly as possible.

Despite its continued prevalence over many years, the conventional, centralized mixer approach has some distinct and important disadvantages. A first problem with conventional audio mixing systems is that they do not scale in a natural and easy way. Most users of mixing consoles service a wide range of audio production applications and scenarios, requiring anywhere from one or two channels and a simple mono mix, up to dozens or even hundreds of channels and dozens of separate mixes. Therefore, when purchasing a mixer, it is difficult to determine exactly which size console to buy. Mixing console vendors offer a very wide range of sizes to cover the market space, and buyers must choose something that seems like the right fit, hoping to avoid spending more money or taking up more space than they need to or, on the other hand, hoping to avoid running out of channels or mix busses when they have a large job. Some buyers/users will purchase multiple, different sized mixers to handle different jobs.

A second problem to be solved occurs in networked audio mixing systems, i.e., those that use shared, packet-based networks to interconnect signal input and output (I/O) devices with signal processing devices. These systems typically impose considerable latency in the audio path from signal source to monitor output. This latency—typically on the order of 2 to 10 milliseconds—can negatively impact the experience of, and results achieved by, a performer who is singing or playing an instrument while monitoring himself through the system. The reasons for this increased latency are twofold: first, packet-switched networks have queues and delays within their basic infrastructure, such that signal transport across the network takes an indeterminate amount of time; this mandates a minimum "safety bound," typically on the order of 1 or 2 milliseconds for optimized networks such as those using IEEE Audio Video Bridging standards (and higher amounts for networks using older technologies), that the receiving side must expect in order to avoid "buffer under-run" conditions that cause audio glitches. Second, conventional systems locate the I/O and signal processing/mixing functions in separate physical units; thus for a singer to hear herself in a monitor mix, her signal must make two trips across the network (from the I/O to the mixer and back to the I/O again). The network transport latency compounds with analog-to-digital and digital-to-analog conversion latency to impose a minimum latency typically of 2 milliseconds, and often much more, along the most critical-latency path.

The importance of minimizing latency for a self-monitoring path can be quantified as follows: Each millisecond of latency imposed on an audio signal corresponds to sound traveling through air a distance 0.34 meters (about 13 inches) at sea level. When a person sings, she hears her vocal chords within a fraction of a millisecond as the vibrations are conducted through bone, body tissue, and immediate surrounding air to her ears. When a person plays an acoustic guitar, he hears the sound from the guitar within about 2 milliseconds, since he is holding the instrument no further than about 2 feet from his head. When a group of people perform together (or even when they have a conversation in the same room), they are typically located a few feet apart, thus they hear each other a few milliseconds later than each person hears his or her own voice or instrument. We therefore conclude that self-monitoring becomes unnatural when the signal path from voice or instrument to ears has a latency greater than about 2 milliseconds. However, monitoring others can seem perfectly natural when the signal path latency is 5 or 10 milliseconds or even more.

A third problem with conventional audio mixing systems, as well as modern network-based mixing systems, is that their use of a centralized mix engine creates an inconvenient topology that hinders the ergonomics and increases cost of system setup and maintenance. The central mix engine needs to be set up, powered, and connected with (typically) large numbers of cables to the various devices at the extremities of the system which are located near actual users. This results in a large number of cables crossing through the stage or room, and a large number of potential failure points in the system.

A fourth problem stems from conventional systems' lack of fault tolerance since they rely on a central mix engine for all the audio processing. If a fault occurs in the central mixer (such as a power supply failure or a main CPU crash) then it is possible for the entire system to become inoperable.

SUMMARY

In general, the methods, systems, and computer program products described herein provide distributed audio processing. The architecture is based on audio processing nodes connected with a network and operating as "peer devices" in a system. Advantages of the system include the ability of the system to scale linearly with the number of input channels and output mixes required, reduced audio latency, and improved end-user ergonomics. In general, in one aspect, an audio processing unit comprises: an audio input module for receiving one or more source audio signals; an audio output module for outputting one or more audio mixes; a network connection module configured to send and receive audio signals over a network in substantially real-time; one or more input channels for processing the received one or more source audio signals, wherein each of the received source audio signals is processed by an assigned channel of the one or more input channels, and wherein each input channel includes a channel strip comprising a chain of processing blocks to be applied to the received source audio signal assigned to that channel, and wherein an output of the channel strip is provided to the network connection module for transmission over the network; a digital mixer for generating one or more output mixes by mixing the processed source audio signals received from the one or more channel strips with audio signals received via the network connection module from outputs of one or more real-time audio devices connected to the network; and one or more output channels for processing the one or more output mixes, wherein each of the one or more output mixes is processed by an assigned one of the one or more output channels, and wherein the audio output module is configured to receive and output the processed one or more output mixes.

Various embodiments include one or more of the following features. The audio processing unit further includes a processor for hosting a user interface, and the user interface enables an operator to control parameters of the one or more output mixes. The network connection module includes a network switch including a port connected to the processor, and at least two externally available ports for establishing connections to a plurality of devices on the network, and wherein the network switch is configured to filter and route packets between the network switch ports enabling the network switch to bridge between at least two externally connected network devices and the processor of the audio processing unit. The at least two externally available ports support a daisy chain connection topology. The network connection is configured to receive over the network control commands for controlling parameters of at least one of the one or more input channels, the digital mixer, and the one or more output channels. The control commands are transmitted over the network by a device connected to the network, and the control commands are generated by interaction of an operator of the device with a user interface of the device. The one or more processed output mixes are provided to the network connection module for transmission over the network, and the operator of the device is able to listen to the one or more processed output mix while controlling the parameters of at least one of the input processor, digital mixer and the output processor. A user interface for controlling the audio processing unit is hosted by a second audio processing unit connected to the network. Each of the input channels further comprises a second channel strip for processing the one or more received source audio signals, wherein the output of each of the second channel strips is provided to the digital mixer and to the network connection module for transmission over the network. The outputs of the first-mentioned channel strips are suitable for feeding a local monitor mix and the outputs of the second set of channel strips are suitable for feeding a front of house mix. An output of the digital mixer is provided to the network connection module for transmission over the network. An output of the output mix processor is provided to the network connection module for transmission over the network. The channel strip processing of the received audio signals includes one or more of a rumble filter, equalization, delay, and insert processing. The network connection module is configured to receive pre-mixed audio signals over the network, and the digital mixer is able to generate an output mix that includes the pre-mixed audio signals. The digital mixer is configured to generate one or more output mixes in addition to the first-mentioned output mix, and the audio processing unit further comprising one or more output processors in addition to the first-mentioned output processor, wherein each of the first mentioned output mix and the one or more additional output mixes is processed by an assigned one of the first mentioned output processor and additional one or more output processors to generate a processed output mix for sending to the audio output module. An analog mixer for receiving one or more of the source audio signals in analog form and for mixing the one or more received audio signals in analog form with one or more submixes of signals received from the network via the network connection module, wherein an output of the analog mixer is received for output by the audio output module, such that an audio path latency for the one or more signals received in analog form between receipt by the audio input module and output by the audio output module is less than about 50 microseconds.

In general, in another aspect, an audio processing system comprises: a plurality of end nodes connected by a network, wherein each of the end nodes is configured to send and receive audio signals over the network in substantially real-time, each end node including: one or more audio input ports; one or more audio output ports; an input processing module; a mixing module; and an output processing module for processing a mix received from the mixing module; wherein a first end node of the plurality of end nodes is configured to: receive first audio signals via the one or more audio input ports of the first end node; condition the first audio signals using the input processing module of the first end node; and transmit the conditioned first audio signals over the network; and wherein a second end node of the plurality of end nodes is configured to: receive the conditioned first audio signals via the network; receive additional conditioned audio signals from one or more end nodes of the plurality of end nodes other than the first and second end nodes; mix the conditioned first audio signals and the additional conditioned signals using the mixing module of the second end node to generate an output mix; process the output mix using the output processing module of the second end node; and output the one or more rendered output mixes from the one or more audio output ports of the second module.

Various embodiments include one or more of the following features. Configuring the first and second end nodes to send and receive audio signals over the network in substantially real-time corresponds to a signal transport latency in the network that is approximately equal to an acoustic path latency between a physical location of the first node and a physical location of the second node. The second end node is further configured to: receive second audio signals via the one or more audio ports of the second end node; condition the second audio signals using the input processing module of the second end node; and include the conditioned second audio signals as one or more inputs to the mixing module to generate an output mix that includes the conditioned second audio signals. One or more of the plurality of end nodes each includes a second input processing module, and wherein, for each of the one or more of the plurality of end nodes that include a second input processing module: the first mentioned input processing module is configured to condition the audio signals received, from the one or more audio input ports of that end node for a front of house mix; and the second input processing module is configured to condition the audio signals received from the one or more audio input ports of that end node for a monitor mix local to that end node. Conditioning the first audio signals includes at least one of rumble filtering, equalization, delaying, and insert processing. Rendering the output mix includes at least one of adding reverb effects and equalization, and the rendering is adapted to an output environment associated with the second end node. The audio processing comprising one or more additional end nodes in addition to the first-mentioned plurality of end nodes, wherein each of the one or more additional end nodes is connected to the network, and the one or more additional end nodes includes at least one of a video camera, a digital audio workstation, a mixer control panel, a mobile controller, a video display, and media server.

In general, in a further aspect. An audio processing system comprises: a plurality of end nodes connected by a network, wherein each of the end nodes is configured to send and receive audio signals over the network in substantially real-time, each end node including: one or more audio input ports; one or more audio output ports; an audio processing module for processing audio signals received via the one or more audio input ports; and a mixing module for mixing audio signals; and the system is configured to: at a first end node of the plurality of end nodes: receive a command via a user interface local to the first end node, wherein the command is one of an audio processing command and a mixing command; and transmit the command across the network; and at a second end node of the plurality of end nodes: receive the command; and execute the command on the second end node.

DETAILED DESCRIPTION

Figure 1:
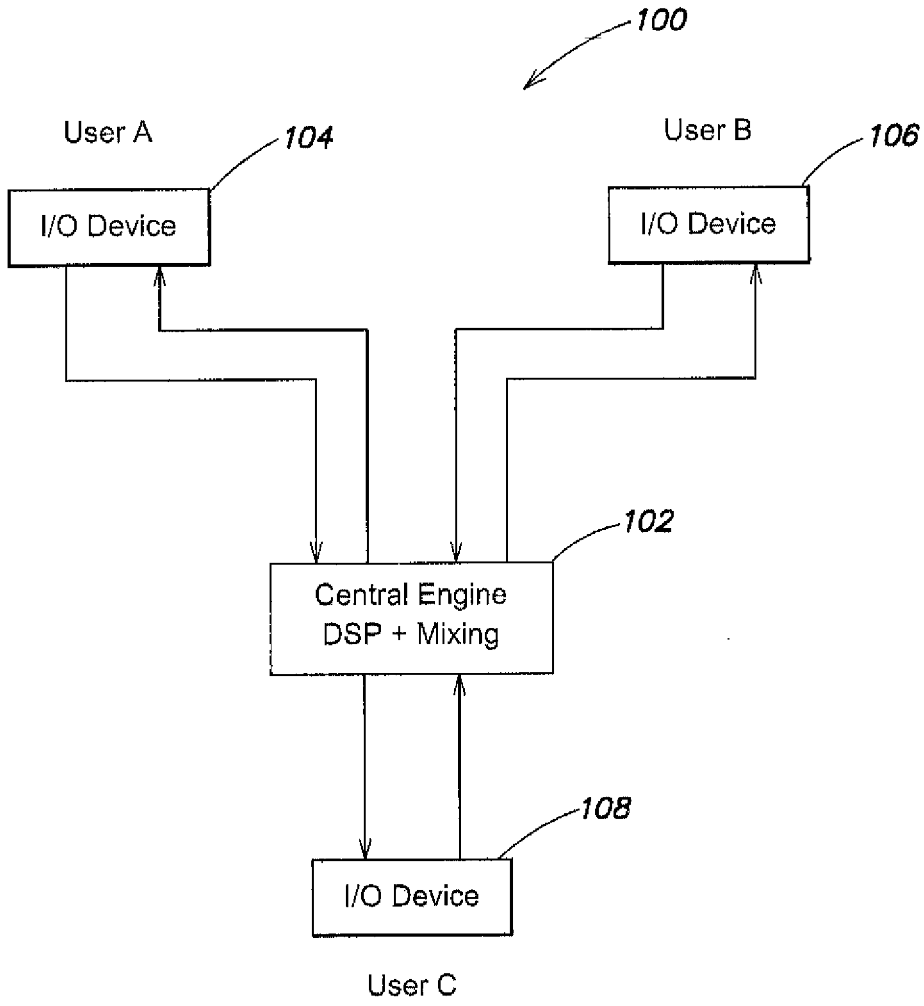
FIG. 1 (Prior Art)
FIG. 1 is a high level block diagram of prior art centralized mixing systems.

The methods and systems described herein enable a real-time audio processing system that uses a distributed architecture that improves scalability, critical-path audio latency, and end-user ergonomics. The new system architecture is referred to as "distributed, self-scaling, network" (or DSSN) mixer architecture.

The availability of modern networking technology such as gigabit Ethernet and IEEE Audio Video Bridging standards, and the ability of this technology to carry large numbers of real-time audio signals between different pieces of digital audio equipment with very low latency, has allowed for a new approach to designing an audio mixing system. The new approach creates a truly distributed and peer-to-peer architecture, rather than centralized system architecture, for acquiring, treating, combining into various mixes, and then re-distributing the multiple audio signals in a sound mixing application. The distributed nature of this new architecture enables compelling solutions to common problems found in conventional mixing console systems, including the scalability, latency, ergonomics, and reliability problems described above.

The approach described herein features a self-scaling architecture, based on the way devices aggregate to grow the mixer size. Aggregation involves combining two or more physically separate mixers to achieve a larger overall mixer that is treated as one. Conventional mixers aggregate to expand input channels, but typically the mix busses simply cascade from one unit to the next, not increasing in number. Specifically, the mix bus output signals from one mixer are simply summed with unity gain into the mix busses of the next mixer downstream in the signal flow chain. While expansion is achieved in the number of sources that can be mixed, no additional mixes (i.e., separate, final output signals) are created. We refer to this as "one-dimensional scaling." With the DSSN architecture, both input channels and mix busses scale in number as more physical units are added to the system. We refer to this as "two-dimensional scaling." The benefit of two-dimensional scaling becomes especially compelling in situations where each performer desires his own custom monitor mix—a practice that is commonplace in high-end applications such as professional concerts, and is becoming more widely expected in lower-end applications such as rehearsals, small-scale concerts, churches, and corporate audio/video applications. DSSN architecture treats each performer (or localized group of performers, such as a horn section or a trio of background singers), as an endpoint of the distributed system, with each endpoint having both source signals and the need for unique output mixes. DSSN architecture also treats the audience itself—or even multiple audiences in separate locations, or multiple zones in a large venue—as separate endpoints in the system requiring unique output mixes, and in some cases having source signals to contribute into the system (such as audience microphones to pick up audience sounds and room ambience).

A key to enabling two-dimensional scaling is the network's ability to deliver a large number of source channels to each and every end node (separate physical device) so that all end nodes can create independent mixes across their local set of busses. A DSSN-based mixing system achieves this by having a number of end nodes connected by a network, with each of the end nodes having its own I/O, input channel processing, mixing, and output channel processing capability.

With DSSN architecture, end nodes are simply added to the system according to I/O requirements for a given application. The facilities for input processing, mixing, and output processing are built into each of the end nodes, such that all I/O points have the processing they need to service the performers or operators interacting with the various end nodes. Unlike working with predetermined mixer size options, a user of a DSSN-based system can incrementally add processing channels or mix busses to match the amount of audio I/O facilities required for the application at hand. This is easily accomplished by plugging additional end nodes into the network.

Another significant advantage of DSSN architecture is its fundamental and significant reduction of critical-path audio latency within a network-based mixing system. DSSN architecture achieves this by omitting trips across the network for critical path signals. For self-monitoring, which is by far the most critical path requiring low latency, the signal path never traverses the network. Thus, instead of two network delays which occur in conventional network mixing systems, DSSN architecture-based systems provide fully featured, self-monitoring audio paths having zero network delays. The architecture exploits the theory that the talent's vocal chords or instrument are generally located near her ears; thus, the source signal can be mixed locally with other source signals contributed both locally and from other end nodes on the network, and the resulting mix outputted directly to the talent by the same local unit. Furthermore, the signal path for monitoring source signals inputted at other end nodes on the network incurs just one trip across the network (compared to two trips for a conventional system with centralized mix engine).

The DSSN network described herein enables end nodes connected to the network to exchange audio signals in substantially real time. As used herein, substantially real-time means that a delay between the input of an audio signal and the output is delayed by no more than the amount of time for sound to travel across a moderate sized room or space. An upper bound to such a delay is in the range of 30 to 50 milliseconds, which contrasts with the typical latency of audio signals traveling across wide-area or cellular networks, which often exceed 100 milliseconds.

Figure 2:
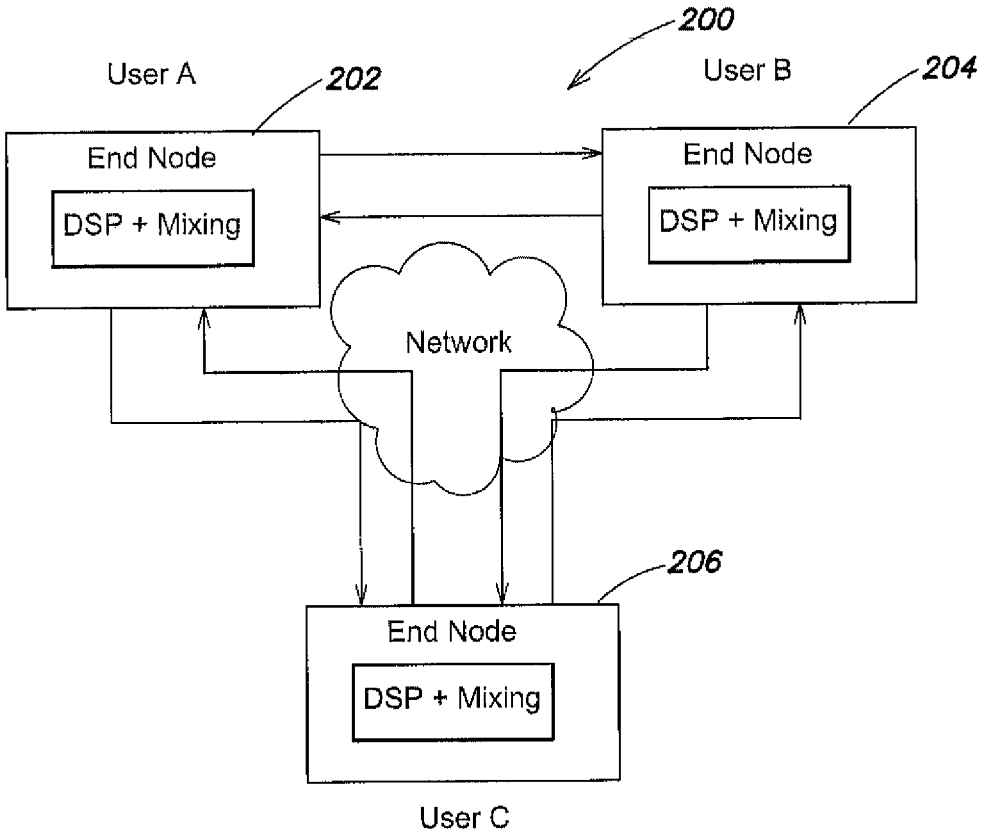
FIG. 2 is a high level block diagram of a distributed self-scaling network audio processing system.

FIGS. 1 and 2 illustrate fundamental differences in the architecture between centralized prior system, and DSSN architecture-based systems, and show how the architecture reduces latency. FIG. 1 illustrates audio mixing system 100 having a centralized architecture, with central engine 102 performing the signal processing and mixing connected in point-to-point fashion to input/output devices 104, 106, 108 located next to Users A, B, and C respectively. In such a system, for User A to monitor himself requires two network trips: the first to transmit the audio to central engine 102, and the second for the central engine to transmit the monitor mix back to I/O device 104 collocated with User A. For User A to monitor another user, e.g., User B, two trips are also required: the first for User B's I/O device 106 to transmit to the central engine, and the second for the central engine to transmit onward to User A. Thus all monitoring results in a minimum monitoring delay of two network delays plus the delays associated with conversion of the signal from analog to digital at the input, and digital to analog at the output.

By contrast, in DSSN-based system 200 shown in FIG. 2, each of the end nodes (202, 204, 206), includes local signal processing and mixing capability. The end nodes are connected by network 208, such as a Gigabit Ethernet network. When a user monitors himself, there is no network usage because the entire path from his source signal input to his monitor signal output is contained within end node 202. Furthermore, because this audio path excludes the network (a digital medium), the monitoring could be done entirely in the analog domain, thus also avoiding the latency associated with analog to digital conversion and digital to analog conversion, resulting in zero latency monitoring. If some level of delay is desired for time aligning source signals with signal paths used to monitor other end nodes, an artificial delay can be inserted in the local end node's DSP path. This contrasts with a network-based mixer using a central engine, in which the delays imposed by the network cannot be eliminated. In DSSN mixer architecture, monitoring of others on the network is also improved significantly compared to a conventional, centralized system. These paths incur just a single trip across the network instead of two. For example, when User A monitors User B, there is a single network trip of the audio from end node 204 to end node 202.

Figure 3:
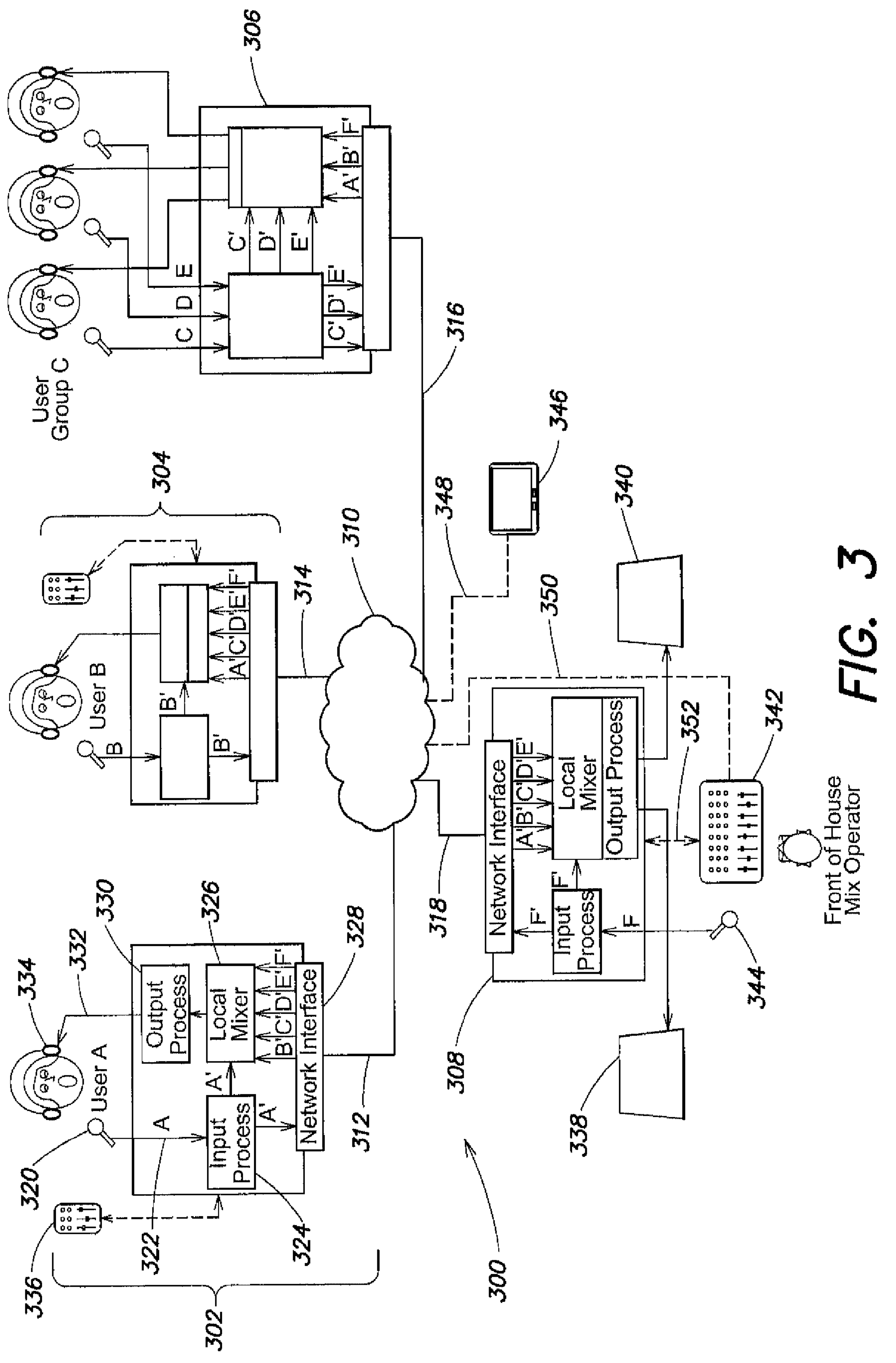
FIG. 3 is a block diagram of a distributed network audio processing system with six audio sources and seven mix outputs spread across four end nodes.

FIG. 3 provides a high level diagram of illustrative DSSN architecture-based system 300 with six audio sources and seven mix outputs spread across four end nodes. End nodes 302, 304, 306, and 308 are each connected to network 310 via wired or wireless links 312, 314, 316, and 318 respectively. DSSN mixer end nodes and any end nodes connected to the network communicate directly with each other over network 310, obviating the need for a central, intermediary or master, device to manage and/or direct communications among the different devices.

As illustrated in FIG. 3, an end node serving a performer, such as end node 302 serving User A, includes an audio capture device, such as microphone 320 connected via pathway 322 via an audio input module (not shown) to end node 302. The end node performs input processing at input processing module 324, and passes the processed signal (A') to local mixer 326 and network interface 328. At local mixer

326, the processed signal from User A may be mixed with input-processed audio signal inputs from other end nodes (B', C', D', E', F') received via network interface 328. A local monitor mix is output from local mixer 326, undergoes output processing at output processing module 330 before being sent via an audio output module (not shown) via pathway 332 to an audio output device, such as headphones 334. End node 302 may include monitor control panel 336 for providing a user interface to User A, from which control commands are passed to one or more of the processing modules in end node 302 or transmitted over network 310 via network interface 328 to control functions within other end nodes as needed, depending on the application at hand. Monitor control panel 336 may be external to the main chassis of end node 302 (as illustrated in FIG. 3), or embedded within the chassis, depending on the form factor and usage model of the particular end node. In some cases this user interface may be implemented on a single touch screen, while in other cases it may be implemented with dedicated knobs, switches, LEDs, character displays, and the like.

As illustrated in FIG. 3, each of the four end nodes has its own local mixer, and each of these local mixers is fed by all six conditioned/enhanced source signals A' through F'. Thus each end node, using its local mixer, is capable of producing independent mixes for local delivery to its user or users for listening. In addition, the self-monitoring path(s) for each end node can be optimized for lowest possible latency since the signal chain from audio source to input process, to local mixer, to output process, to monitor output signal, is contained within the local end node and does not traverse the network.

End node 308 serves a front of house mix operator as well as the audience to which he delivers the main "house mix" via loudspeakers 338 and 340. In the illustrated example, the node includes large mixer control panel 342 and loudspeakers 338, 340. Talkback microphone 314 delivers audio source signal F into the system, allowing the front-of-house mix operator to relay verbal information into the headphones of Users A, B, and C via F' while hearing his own voice with optimally low latency in loudspeakers if he so chooses (not shown). It would also be common for a front-of-house mix operator to have a separate "cue mix" output (not shown), typically feeding headphones, that he can use to audition different mixes, hear the talkback communications among users, or monitor other signals that are not fed to audience loudspeakers. Aside from the nature of their respective users, each of end nodes 302, 304, 306, and 308 include fundamentally the same basic capabilities. Thus, a common end node architecture is capable of supporting both on-stage performers and the "house mix" in a live concert application. Also illustrated is separate mobile controller 346, connected to the network via wireless link 348, enabling control commands to be entered using a mobile device that does not need to include audio processing capability.

FIG. 3 illustrates the self-scaling feature of DSSN architecture in that both the number of sources and the number of mix outputs supported by the overall system scale up or down as end nodes are added or removed. For example, if User A and User B want to rehearse together, then the end nodes serving User Group C and the Front of House Mix Operator may be omitted, and the system scales down to two inputs and two mix outputs with no loss of useful functionality to User A or User B. In another example, loudspeakers 338 and 340 may be implemented as separate DSSN mixer end nodes, each producing a single mix output to drive its local amplifier and transducer elements, which would obviate the need for end node 308. In this case the large mixer control panel 342 could communicate with designated end nodes, such as those embedded in loudspeakers, over the network using optional network link 350. In this scenario, mixer control panel 342 and mobile controller 346 are essentially equivalent from a system point of view, differing only in their form factor and user interface. For an application requiring a large number of loudspeaker units, for example to cover a large concert venue, a configuration having a DSSN mixer end node inside each loudspeaker allows each loudspeaker to generate its own unique mix based on its location, acoustical environment, and proximity to certain listeners. The self-scaling property ensures that the system does not have too many or too few mix busses as loudspeakers are added or removed from the system.

The distributed nature of a DSSN-architecture mixing system provides clear benefits with regard to fault tolerance. Specifically, if a given end node has a failure, the remaining end nodes continue to operate without loss of any functionality except the audio sources feeding the inputs of the failed end node. The only mixes that are lost are those produced by the failed end node. With a centralized mixer architecture, it is possible to lose every mix output, or even every audio path in the system if the central mixer fails.

FIG. 3 also illustrates the distributed nature of control in a DSSN mixer system. Front-of-house mix operator controls the system using mixer control panel 342, which sends and receives control commands to and from end node 308 either via direct connection 352, or via network link 350. A separate operator may control the system from remote locations by operating mobile controller 346 connected to network 310 via wireless link 348. User A controls the system using monitor control panel 336 of local end node 302. User Group C has no local control panel and instead these performers rely on other users or operators to control the parameters of their input process, local mixer, and output process by sending and receiving control commands from one or more remote nodes on the network. Each parameter or function within the overall system may be individually addressable, allowing for arbitrary mappings between the point of control and the function to be controlled. For example, User A might choose to control the monitor mix for a first singer in User Group C, while a second singer in User Group C chooses to have his mix controlled by the front-of-house mix operator, and a third singer in User Group C chooses to have his monitor mix controlled by a roaming engineer operating mobile controller 346. The combination of the four DSSN mixer end nodes, the various controllers connected directly or indirectly to the network, and the "all-to-all" connectivity among all devices, as illustrated in FIG. 3, serves as an overall audio mixing system that operates as a whole while being distributed among multiple physical units located optimally near the various and respective users of the system.

A network topology, as illustrated in FIG. 3, is contrasted with point-to-point interconnection topology, in which devices use multiple, dedicated links to communicate with each other, each link supporting communication, either unidirectional or bidirectional, between exactly two devices. If the system illustrated in FIG. 2 used point-to-point links instead of a network, it would require each end node to have two separate transmit links and two separate receive links, to communicate with all the devices in the system. If this system were scaled up to ten end nodes, each would require nine separate links in each direction, for a total of 90 links in the system. Thus, the network connection topology improves tremendously upon point-to-point topologies, making system setup and connection much easier. DSSN mixer architecture depends on a network connection topology to achieve scalability without complicating the interconnect problem.

In practice, computer networks utilize switches and routers to facilitate communications between end nodes; however these devices do not participate in end-node conversations; they merely serve to provide multiple access points to the common network by providing a sufficient quantity of network ports for end nodes to plug into. Network switches and routers may also filter and direct network traffic between ports to improve network efficiency, once they learn the addresses of the devices connected to each port.

In some applications, it may be not be desirable to require a separate, network switch or router unit in a DSSN mixing system. Reasons for this may include saving system cost, or simply the lack of availability of such a unit to some users. To accommodate this case, some embodiments of DSSN-architecture devices may include a built-in network switch having at least two ports available for users to connect to other network nodes in the system. With this feature, a DSSN end node can facilitate a "daisy chain" connection allowing it to be inserted between any two devices on the network and maintain communication paths between any combination of itself and the other two devices. It is possible to connect a large number of end nodes this way without requiring a separate network switch or router device, since each end node can pass messages on to the next one in the chain in either direction such that all devices in the chain can communicate on the same network.

DSSN architecture permits delays to be specifically programmed in order to mimic acoustic path latency of group performance. This may help members of a performing group perceive each other in a manner that more closely simulates an acoustic environment. For example, a particular stream that carries audio data from one end node to another can be programmed with a "presentation time" commensurate with the physical distance between the two nodes (or more appropriately, between the two users located near these respective nodes). The receiving node will use the presentation time parameter (or a similar mechanism used to encode time delay) to delay the audio before injecting it into the local mixer of the receiving node. Alternatively the sending node may add extra delay to a signal destined for a particular other end node in the system as an operation within its input channel strip processing (described below) before transmitting the audio signal onto the network.

Figure 4:
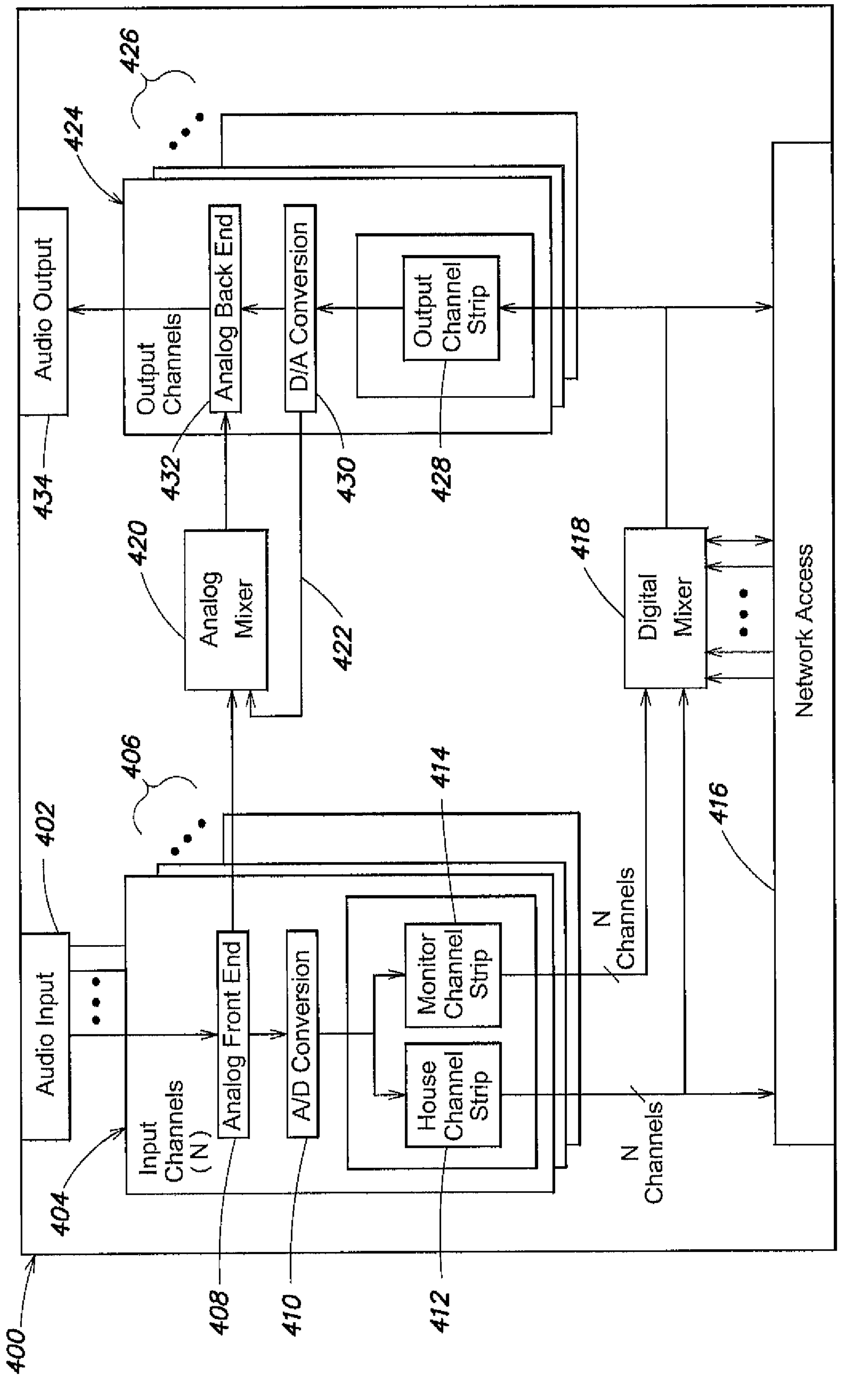
FIG. 4 is a high level block diagram of the input processing, mixing, and output processing functions of an end node of a distributed audio processing system.

Referring to FIG. 4, we now describe an embodiment of an end node 400 in a mixing system based on DSSN architecture. Audio input module 402 includes one or more audio input ports for receiving source audio signals, for example from microphones and instruments. Not all the sources may be active at any given time. For example, an external source selector switch may enable switching from microphone input to a line-level input fed by a different source. End nodes may have 1, 2, 4, 8, 16, or other number of audio input ports. The audio ports may be of different types, such as mic, line, digital, with various corresponding connector formats for all of these. The need for different types of port may be obviated by source selector switching upstream of the input processing channels.

Each of the received audio signals is fed to a designated input channel of one or more input channels 404, 406 of end node 400. Each of the end nodes on the network that services at least one input includes one or more input channels, with the total number required being at least equal to the number of active audio source inputs. In the example illustrated in FIG. 4, N audio source inputs are routed to a different one of the available input channels. In each input channel (e.g., channel 404), the audio input is processed in the analog domain (via analog front end 408), which may in some instances include a preamplifier and in other cases only a simple buffer stage. The input is then converted into digital form by an analog-to-digital converter (410), and then fed into one or more channel strips 412, 414. In some cases the input signal may already be in digital format prior to entering the end node, obviating the need for analog front end 408 or analog-to-digital converter 410. A channel strip includes a chain of processing blocks that are applied to a given input signal in a substantially sequential order. This processing generally serves two distinct purposes: to condition or "clean up" the source signal to make it suitable for downstream processing and mixing with other signals; and to enhance—or deliberately modify—the sonic character of the audio source, to make it more pleasing in the context of the overall mix or output signal delivered to an audience or user. This distinction can sometimes be subtle, and in many cases there is overlap between conditioning and enhancement, especially because the intent of both is to improve the sound quality of signals. However, we make this distinction to highlight the importance of the location of certain audio processing functions within the overall system architecture. As will be apparent in the descriptions and diagrams that follow, this placement choice has a very large impact on the scalability and functional power of an overall mixing system built from distributed components.

For completeness we now describe some examples of signal conditioners and signal enhancers. Signal conditioners include, but are not limited to: a high pass filter (also known as a low-cut filter or rumble filter); dynamics processing, which may include an expander, a gate, a compressor, a limiter, or a multi-band dynamics processor; an equalizer, such as a parametric type with multiple bands having gain, frequency, and bandwidth parameters, and shelving equalization; delay used for time alignment; a de-esser (to remove sibilance from a signal); and an adaptive feedback eliminator. Examples of signal enhancers include, but are not limited to, non-linear processes that change a signal's harmonic structure, such as tube simulation, magnetic tape simulation, speaker cone simulation, and various other algorithms which are often described by subjective terms such as "warmth," "brilliance," "luster" and the like; processes that utilize splitting, phase shifting and re-combining, such as chorus or flinger effects; pitch correction or modification (for example, the popular "auto-tune" algorithm), and instrument replacement (sometimes known as re-voicing). It is also common practice to use equalizers and dynamics processors (as described above) for signal enhancement purposes.

Other functions that may be included in an Input Channel Strip include metering, routing, and panning. Metering allows a user to visually monitor the amplitude of an audio signal. The inclusion of metering in an Input Channel strip helps a mix operator to monitor all his audio sources and make sure he is receiving the proper level that he expects, upstream of the mixing function. In some cases a channel strip's functionality will allow a user to position a meter at various points in the strip signal chain, or it may include multiple meters acting simultaneously along the signal chain. Routing functions enable a user to change the order of signal processing blocks, select tap points in the chain signal chain for feeding certain mix busses or other outputs, and to assign or de-assign channel outputs to mix busses or other non-mixed destinations (sometimes called "direct feeds") in the system. Panning is the positioning of a source, typically within a stereo or surround-sound mix, to a desired location. For example, in a stereo mix a source may be panned to the left, to the center, to the right, or anywhere in between. In a stereo surround mix, signals may be panned left versus right, front versus back, and also set to desired level of intensity in the subwoofer channel.

In embodiments having a single channel strip per input channel, only a single conditioned and/or enhanced input signal is produced. This is used for all mixes, including the local monitor mix and front-of-house mixes. The embodiment illustrated in FIG. 4 includes two channel strips 412, 414 for each input channel. The digitized audio signals are fed to each of the strips in parallel. The first strip is primarily used to support a front-of-house mixing workflow, while the second strip is used to support a separate monitor mixing workflow. The front-of-house version is fed to network access module 416, and is made available on the network (e.g., FIG. 3, 310), that connects the various components that comprise the mixing system. In some embodiments, the output of the monitor channel strip is also made available on the network (not shown in FIG. 4).

Various embodiments also include one or more additional channel strips per channel. For example, an aux/bonus channel strip provides a third variant of the audio inputs for various uses, such as a click track generated from a kick drum source which can be useful for musicians to monitor song tempo clearly while performing.

Some embodiments may include local analog mixer 420 to support a zero-latency monitoring path from audio source input to analog monitor output. This path subverts A/D converter 410 and D/A converter 430, as well as all the processing stages in the digital domain, to provide a monitor mix that includes non-delayed audio source signals delivered by analog front-end 408 mixed by analog mixer 420 with submixes containing all other signals of interest, produced by digital mixer 418, processed by output channels 424, 426, and converted back to analog by D/A converter 430 and delivered to the analog mixer along path 422. In actual systems, it is expected that the latency in a "zero latency" analog only pathway is not more than about 50 microseconds, with the latency defined as the time between receipt of an audio signal at audio input port 402 and output of the analog-mixed signal from audio output port 434. This zero-latency analog path can be supplemented with reverberation to enhance the audio source signals feeding into the analog mixer, and in many cases performers desire reverberation on their own voice or instrument in their monitor mix to achieve a more ambient and natural sound. Some amount of signal conditioning and/or enhancement, such as EQ or Dynamics, may be implemented by analog front end 408 to better prepare the signal for injecting into analog mixer 420. Reverberation may be applied along the digital signal path, by monitor channel strip 414, producing a reverb-enhanced version of the source signal which is fed into digital mixer 418 where it is available to be submixed with other sources and then combined in the analog domain back into the final monitor mix. Because reverberation is a process that fundamentally relies upon delaying the source signal, the delay produced by the digital path does not hinder the zero-latency monitoring effect. In other words, there is no such thing as "zero-latency reverb."

Network module 416 connects end node 400 to a network that connects it to other end nodes as well to other devices that may be included within the DSSN architecture-based audio mixing system. In the described embodiment, the network is a packet-switched network, such as Ethernet, connected to network module 416 via one or more standard Ethernet jacks or equivalent, and/or via a wireless connection.

The one or more versions of the N processed channels are fed to digital mixer 418. In the described embodiment digital mixer 418 is a digital matrix mixer capable of weighted mix summing. In addition to receiving the local source channels, the mixer receives processed channels over the network. These channels may be made available over the network from other end nodes, or from other devices on the network, as described below. In addition, local mixes from other end nodes may be available on the network and input digital mixer 418, which we also refer to as the "local mixer" to indicate that it is collocated with a performer providing audio input to node 400.

The system allows for a local mix generated on one end node to be monitored remotely, i.e., by a user located at a different end node. This would be common practice in applications where a dedicated "monitor mix engineer" controls the mixes outputted to individual performers, and needs to hear each of those mixes while he is adjusting them. In this application the latency imposed by transporting a local mix from one end node across the network to the monitor engineer's end node is inconsequential because the monitor engineer is only monitoring others and not monitoring himself. It is generally true that the monitor engineer could replicate the same remote mix that he wishes to monitor, using the local mixer of his local end node configured to replicate the mix parameters as they are set in the remote node; however the engineer would likely prefer to directly monitor the exact signal that is being generated within the remote end node, so that he can be sure he is hearing exactly what the remote user is hearing. This is sometimes referred to as "confidence monitoring."

The mixer output(s) are fed to one or more output channels 424, 426. The number of output channels provided generally corresponds to the number of different mixes to be output by the end node. For example, if multiple performers are sharing a given end node, and each desires a custom mix, the number of output channels needs to be at least as large as the number of performers sharing the end node. Different output mixes may also be required to drive different audio output devices, such as headphones or loudspeakers. Furthermore, when an output is configured as stereo, the corresponding mix comprises two discrete channels, left and right. It is common for such a two-channel stereo mix to be referred to in singular sense (i.e. "a mix"), because it feeds a singular destination such as a pair of headphones worn by a single user. The same principles apply to surround mixes, which comprise more than two channels, for example a 5.1-channel surround mix has six discrete channels and a 7.1-channel surround mix comprises 8 discrete channels. Similarly, the processing channels that are used to apply enhancements to stereo or surround mixes may be referred to in the singular sense; for example a "stereo output channel" actually comprises two discrete paths, left and right.

Each of the output channels includes its own output channel strip 428, D/A converter 430, and "analog back end" 432. The primary purpose of output channel processing is to adapt the outgoing local mix to the environment in which the mix is to be heard, the output device (e.g., headphones, loudspeaker, or line-out for onward transmission), as well as for the specific requirements of individual performers or other users of the system such as mixing engineers. In general, the output channel strip comprises various signal processing functions arranged in sequential order, in similar fashion to the input channel strip described previously, but configured to suit output channel processing purposes described above rather than to condition or enhance audio source signals. Accordingly, an output channel strip might include some or all of the conditioners and enhancer functions described previously in the context of the input channel strip.

From the output channel strip 428, the processed signal is fed to D/A converter 430, analog back end 432, and on to audio output module 434. The audio output module includes connectors suitable for various audio output devices, such as loudspeakers, headphones, and also line out signal. In addition the signal from the output channel strip may be delivered to the network via network connection module 416, thus making the local mixes available to other devices and users on the network.

In DSSN architecture, source audio signals are both received and processed (i.e, conditioned and/or enhanced, and thereby prepared for mixing) within the same end node, before being transmitted onto the network. Consequently, an end node receiving these pre-processed audio source signals from the network is able to inject them directly into its local mixer, without needing to thriller process these signals between reception and mixing. This aspect contributes to the self-scaling property of DSSN architecture because the processing-intensive "heavy lifting" of conditioning and/or enhancing operations does not need to be performed at the end node on the receiving end of the network. Instead, the burden of conditioning and enhancing is kept at the transmitting end node, where the source signals first enter the system. Natural self-scaling is achieved because end nodes are added as needed to accommodate the number of users (this number generally scales with the number of audio sources in the system), and each node brings its own supply of input channel processing resources to add to the overall system. The self-scaling feature of DSSN architecture requires an adequately sized mix matrix at each end node, as well as the ability to receive a large number of individual source signals from the network. This aspect needs to scale up in a DSSN-architecture system with increasing size of the mixing application. Specifically, both the mix matrix and the network connection need to support enough inputs to accommodate the maximum number of sources that any given mix will need to include. With gigabit Ethernet, it is straightforward to carry 200 or more linear PCM-encoded audio signals on one link, and with modern processing devices such as FPGA-based mix matrix computational units, DSPs, or general purpose CPUs designed to compute matrix sums efficiently, hundreds of signals can be mixed readily without undue expense. In contrast, the signal processing operations involved in conditioning and enhancing signals typically involve operations that are much more complex and burdensome than mixing or network transmission/reception. As one example, a dynamics processor such as a compressor, limiter, expander, gate, or multi-band compressor, employs amplitude detection, dynamic gain lookup and computation, and the application of time constants within these operations. Such operations do not map naturally onto the computational units found in today's FPGAs, DSPs, and CPUs. As a second example, nonlinear processes that simulate phenomena such as tube amplification and saturation, or magnetic tape saturation, typically involve complex operations such as lookup tables, hysteresis loops, polynomial or spline computation, or adaptive equalization. As a third example, reverberation effects involve large memory buffers, filters, randomized summing operations, and more. Thus, as distributed mixing system that applies conditioning or enhancement processing on the receiving end of the network is greatly disadvantaged in its ability to scale, because the receiving node would run out of processing resources as sources are added to the system.

Figure 5:
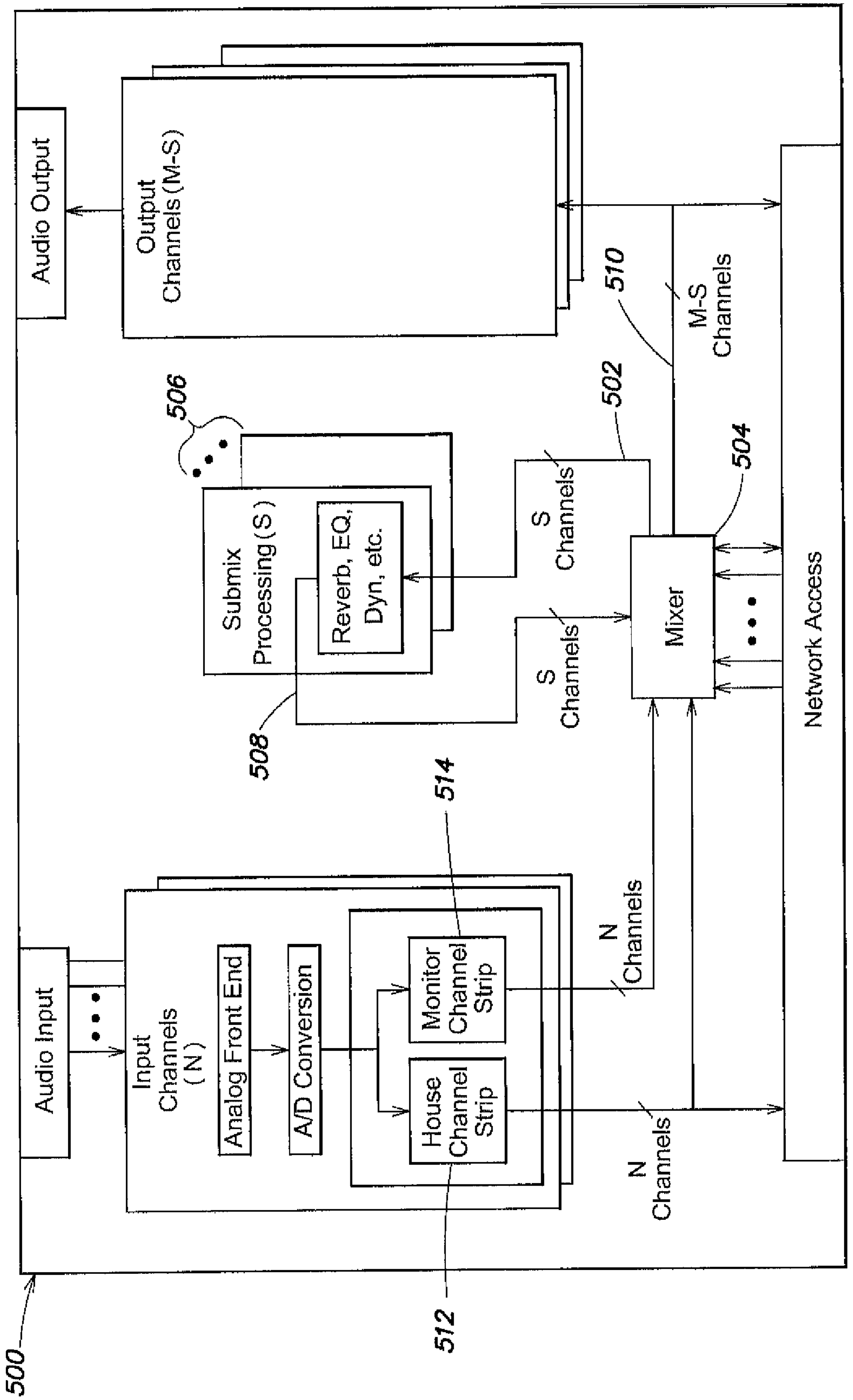
FIG. 5 is a high level block diagram of an end node of a distributed audio processing system illustrating submix processing.

FIG. 5 illustrates the splitting up of output processing in end node 500 into submix processing and actual output processing. S different mixes 502 from mixer 504 are output to S submix processing channels 506, each of the submix outputs being sent to a corresponding one of the submix channels. The submix channels may all be implemented on one or more processing devices, which might include DSP or FPGA or general-purpose CPU type devices. The submix channel processing blocks may include various effects, such as reverb, EQ, echo, and delay. After processing, the S outputs 508 of the submix channel processors are fed back as inputs to the mixer, and are available for mixing into output channels for processing in the output channels. Mixer 504 outputs a total of M mixes, of which M-S (510) are directed to a corresponding number of output channels.

Submixes serve to improve the local output mix on a particular end node in a number of ways. One way is to enable sound engineers to "divide and conquer" the mixing task using a hierarchical grouping. Similar signal sources are assigned to their own group mixes, which are then fed into the main mix, thereby reducing the number of separate sources that contribute to the main mix. As an example, ten drum microphone inputs may be mixed into a stereo pair of "master drum" signals feeding the main mix Other examples include horn sections or background singers. Another way in which submixes may improve the local output mix is to allow effects to be applied to a group of channels using a single instance of an effects processor. The output of the effects processor is then assigned to the main mix, and treated as just another channel (often called a "reverb return" or "effects return" depending on the usage). This is much more efficient than having separate instances of the same effects processor running on input channel strips upstream of the mixer. It also provides a reasonable model of actual reverberation, as multiple sound sources stimulate the air of a common acoustical space, and the resulting echoes and reflections are summed with the direct sound at the listener's ears.

A further advantage provided by network-based, distributed systems is the ability to control the signal processing, mixing, and routing operations remotely from user interfaces connected on the network, which means that these "signal operations" no longer need to be carried out in the same locations where the sound engineer, technicians, or performers may be controlling the system.

Figure 6:
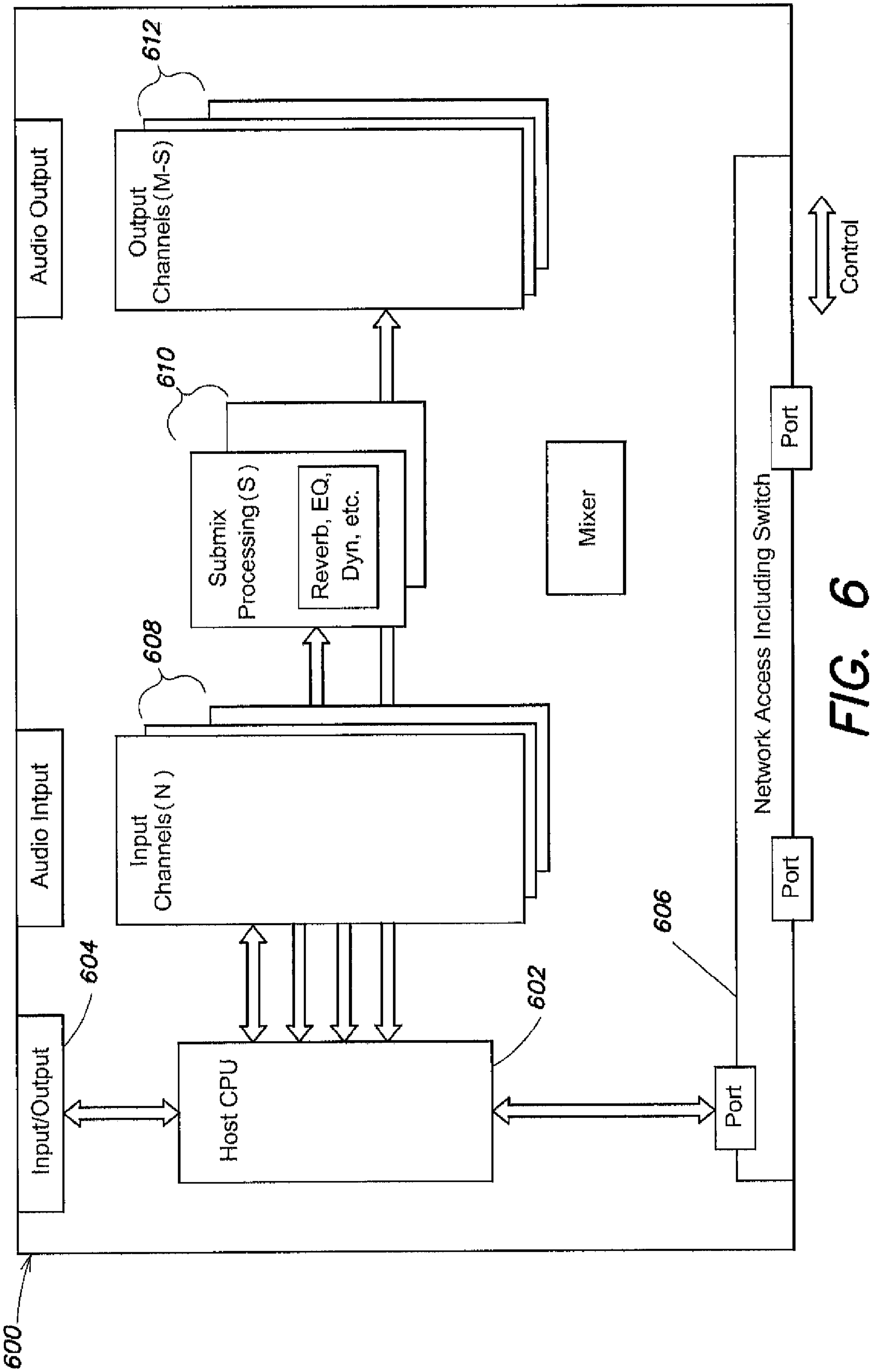
FIG. 6 is a high level block diagram of an end node that includes a CPU for hosting a local UI.

DSSN architecture-based systems enable the user interface for any device or function in the system to be hosted locally, remotely or in multiple locations on the network simultaneously. FIG. 6 is a high level block diagram of an end node 600 showing control pathways within the node, and omitting audio signal pathways. Node 600 includes CPU 602 for controlling the various components of the node, and for hosting a local user interface for the node. The CPU exchanges control commands and data with input/output 604, which may include a control panel with a built-in display, or a separate display with keyboard, mouse, or other devices for receiving user input such as wireless interfaces, e.g., for Wi-Fi devices such tablets and smartphones. CPU 602 is also in data communication with network access 606. Network access 606 includes a multi-port switch capable of passing both control and audio (and video) traffic between external ports and the local end node. CPU 602 may host an interface for controlling remote other end nodes over the network, or receive control commands from UI's running on other nodes. Host CPU 602 may also issue commands for configuring the audio processing distributed system. The figure also illustrates control pathways from CPU 602 to input channel processing 608, submix processing 610, and output channel processing 612.

Such remote user interfaces are capable of offering fall control of any given device. For example, the input processing, mixing, and output processing may all be controllable by one or more remote users. Different users may be given specific permissions to access different functions within the system, or even different functions within a given end node, while being disallowed from accessing other specific functions in the system or a given end node. For example, User A in FIG. 1 may be able to control his local mixer but not the parameters of his input processing channel. Alternatively, referencing FIG. 5, the local user of the illustrated end node might be given permission to control his monitor channel strip (514) but not his front-of-house input channel strip (512), because all control of the front-of-house input channel strip should remain the responsibility of the remotely located front-of-house mix operator. The UI may be hosted by a device that is not co-located with any of the audio sources. Such a device may be implemented on a client computer, or on a portable device connected wirelessly to the network, such as a smartphone or tablet.

As indicated above, in addition to the individual conditioned audio sources local to each of the nodes, various local mixes are made available on the network. This enables a user at a first end node to listen to and adjust a mix delivered to the network by a second end node having audio source input. The processing power to perform this adjustment may be performed by the first end node, i.e., local to the user making the adjustment, or may not involve anything more than the user interface hosted by the first end node and instead using processors on the second end node or on another device on the network. Alternatively, processing may be performed partially on the first end node and partially on the second end node. For example, input processing may performed on the second end node local to the audio source and mixing and output processing may be performed on the second end node local to a remote user.

End nodes may exclude audio inputs and only provide audio outputs. Conversely, end nodes may exclude audio outputs and only provide audio inputs. Such "unidirectional" end nodes may be included in an overall DSSN mixing system without impairing the scalability of the system or the benefits of DSSN architecture; however it is recognized that such end nodes do not include the low-latency self monitoring feature, simply because this feature requires both inputs and outputs on the local device. An example of an output-only end node would be a network-connected loudspeaker. By having an internal (local) mixer and output processing chain, this device can create its own custom mix for direct outputting to the device's amplifier and transducer elements. In this way, an array of loudspeakers configured for 7.1 channel surround sound playback could comprise a set of 8 end nodes, one inside each loudspeaker unit and producing the discrete output channel corresponding to that unit's location in the array. By contrast, in a conventional system, the mixing operations are performed in a centralized mixer, which then feeds 8 separate output signals to the loudspeakers, each of which is configured to receive one signal and deliver that signal to its acoustical output. An example of an input-only end node is a network-connected microphone. Another example is a playback device for delivering pre-recorded audio into the system. In this case, the audio source signals are produced by the audio storage medium rather than physical input connectors. Such a device has no person performing who needs to monitor her performance, and thus has no need for a local audio output. However such a device may still need its audio channels processed before they are presented onto the network for subsequent mixing and monitoring.

In the foregoing discussion, the DSSN architecture-based systems have been described with respect to the processing of audio signals. In addition, such systems are able to support video functionality, particularly because the network that interconnects the end nodes is fully capable of transporting both audio and video signals in real-time, and also because modern VLSI integrated circuits such as multimedia system-on-chip devices designed to manage and process both audio and video signals, have become inexpensive and readily available. The result is that video functionality, which has conventionally been handled by dedicated equipment separate from the audio system, can be merged into the audio system. For example, each end node might have video inputs and outputs (e.g., a camera and a display) in addition to its audio inputs and outputs. Users located at separate end nodes can exchange visual information in addition to their primary mode of interaction involving audio signals. Such a system capability can augment the distributed audio mixer by adding video conferencing functionality to assist performers in communicating with each other, for example by using gestures, if their respective locations are not within a convenient line of sight.

A further, and more specialized, usage of the video communication, referred to as "GUI sharing," can be supported to make the system more user friendly. GUI sharing allows one user at a first end node to operate the graphical user interface of a second user at a second end node, while the video displays on both end nodes are configured to mirror each other. This allows the second user to learn system operations by observing the operations performed by the first user, thus supporting user training functionality.

Another usage of video is to use local processing in an end node to interpret motion or gestures, and use such information as user input to trigger operations within the system. Techniques for motion detection in this context may be based on methods employed by video surveillance cameras that perform in-camera processing for motion detection, and/or on video game systems that optically sense and interpret gesture or movement input.

In yet another application of video in a DSSN mixer system, multiple cameras may be deployed for producing a multi-camera video recording or production of a concert or stage performance without adding separate equipment to the system. Because each end node is likely to be located in convenient proximity to its user/performer, co-location of mixer end nodes and cameras may be quite practical. Additionally, if the front-of-house loudspeakers contain DSSN end nodes, they might also deploy cameras for capturing video from the front, side, or overhead areas of the stage. Until recently, technology limitations have made such integration of audio and video functions impractical; that is, one could not expect to obtain acceptable video quality from such an approach. However, considering the recent widespread availability of low-cost, high-resolution camera sensors, combined with the market's greater appetite for amateur video content, it becomes significantly more plausible to deploy an integrated audio and video system as described above and produce combined audio/video content with acceptable quality for consumers.

Figure 7:
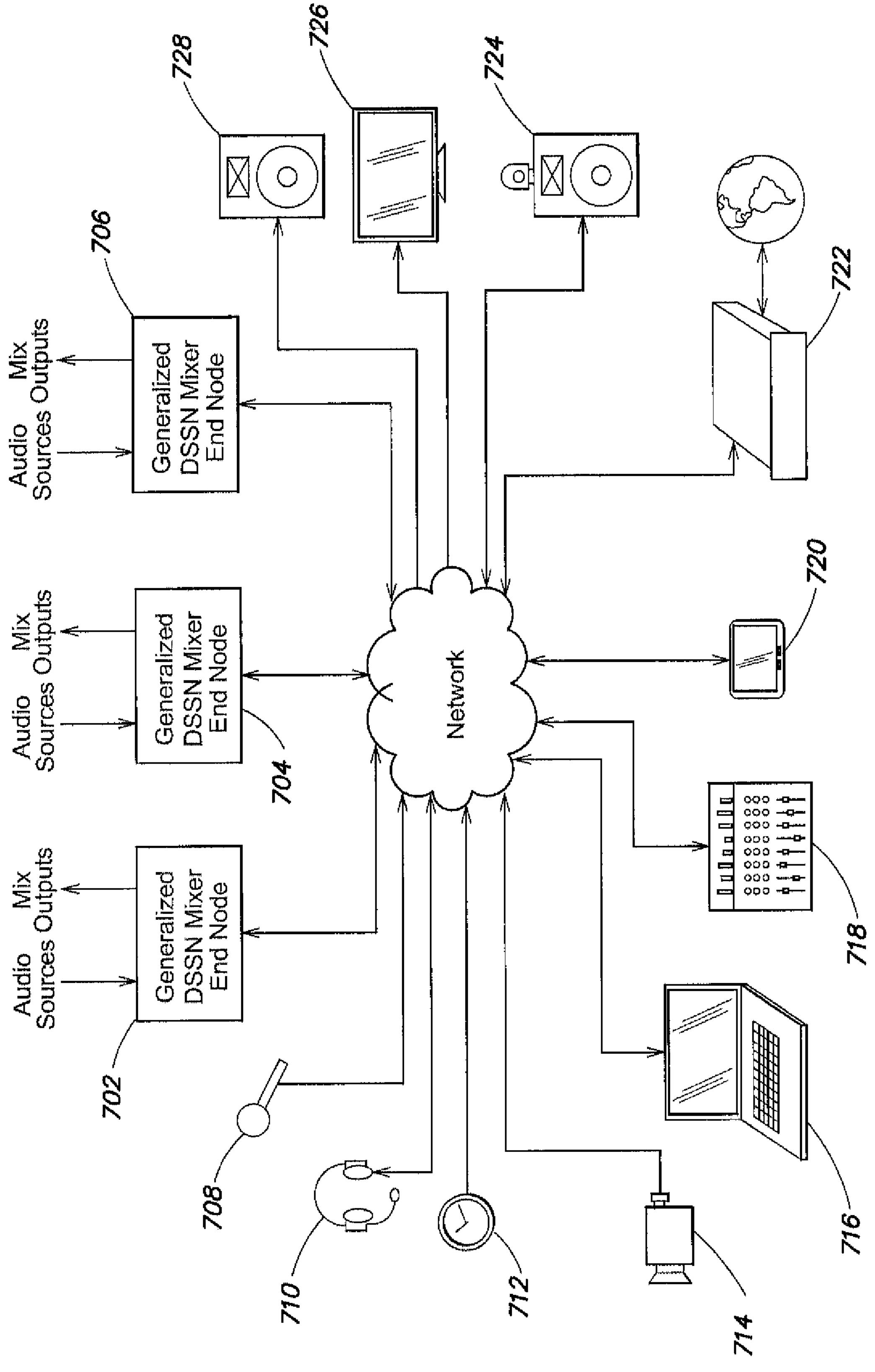
FIG. 7 illustrates a range of end node types that may be linked to the network as part of a distributed self-scaling network audio processing system.

FIG. 7 illustrates a range of end nodes that may be connected to a DSSN audio mixing system in addition to generalized DSSN audio mixer end nodes (702, 704, and 706), which correspond to the end nodes described above in connection with FIGS. 4-6. In addition to the one or more end nodes on the network, a DSSN architecture-based mixing system may include other audio processing, video processing, control, or input/output devices. For example, some end nodes may be of the traditional variety, with I/O but no local processing or mixing capability. For such end nodes, the digitized, unprocessed signals are made available on the network for processing at another device, and a mix suitable for such an end node can be delivered to the network for output on the end node.

Networked microphone 708 provides audio signals to the network, and may be used to supply audio input where there is no need to monitor any mix, for example in the case of a room microphone used for calibrating a sound system. Networked headset with embedded DSSN mixer end node 710 provides an example in which an end node is pushed to the edge of the system such that no separate physical unit is required to support the audio processing and mixing. Such a node is typically used by a performer for whom low-latency monitoring is crucial. It may also be used by people serving other roles, such as a producer, a director, or a technician to monitor various mixes and evoke talkback (intercom style) to other users on the network. The headset may be controlled by a mobile phone or tablet in the hand of the user, or the user may request another operator in the system to direct different mixes into his headset as needed, for example by speaking instructions into the headset's microphone. Media clock source 712 provides a central house synchronization (sync) source that is fed to all nodes in the system. Traditionally the central sync clock signal was carried over coax cables, but modern networked systems using, for example, AVB (Audio Video Bridging) enables it to be carried over Ethernet. Networked video camera 714 provides a video source to the network, and has a range of applications as discussed above, such as communication of gestures among performers, providing live views of a performance, and video recording of a performance. Digital audio workstation (DAW) 716 may contribute recorded tracks for playback during a live performance, such as extra background vocals, synth or orchestral sounds to supplement a live band's sound, or a click track to provide the musicians with a common time base. The DAW may also be used to record all the tracks so that a concert can be archived or mixed down to a CD, DVD, or file made available for purchase after the show. Such recordings are also used by performers to listen to their performances (with multitrack mixing capability) between performances.

Mixer control panel 718 may be located with the front of house operator, as indicated in FIG. 3, or may be located elsewhere in a performance space. Mobile controller tablet 720 is used by a roving engineer or other team member, as described above in connection with mobile controller 346 (FIG. 3). Media server and gateway 722 provides a means for receiving and sending remote feeds across long distances. Acting in its media server capacity, it delivers background tracks into the performance in a manner similar to that described above in connection with DAW 716. Other end node types include, but are not limited to networked loudspeaker with built-in video camera and embedded DSSN mixer 724, networked video display 726, and networked loudspeaker with embedded DSSN mixer end node 728. The links to the network of the various end nodes shown in FIG. 7 (702 to 728) may he wired or wireless.

Figure 8:
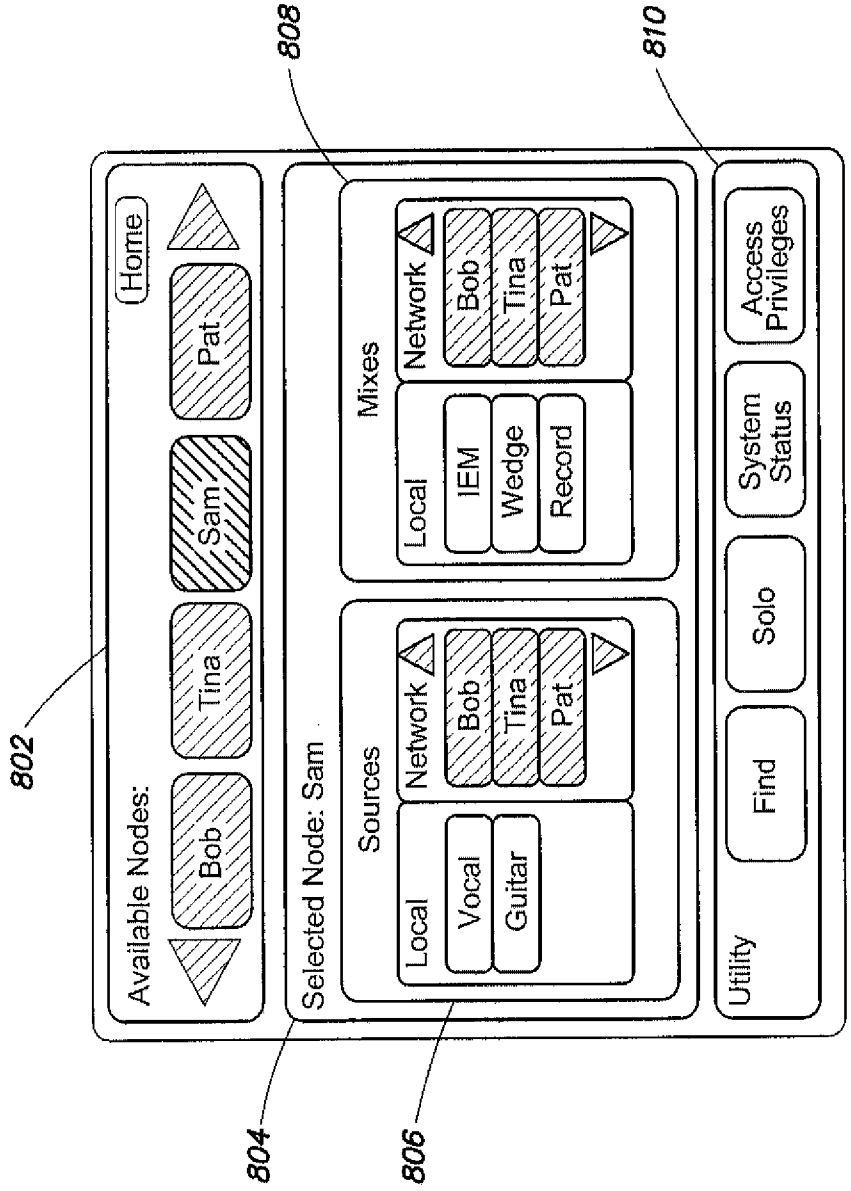
FIG. 8 is a diagrammatic screen shot of a home screen of an illustrative user interface for controlling a distributed audio processing system.
Figure 9:
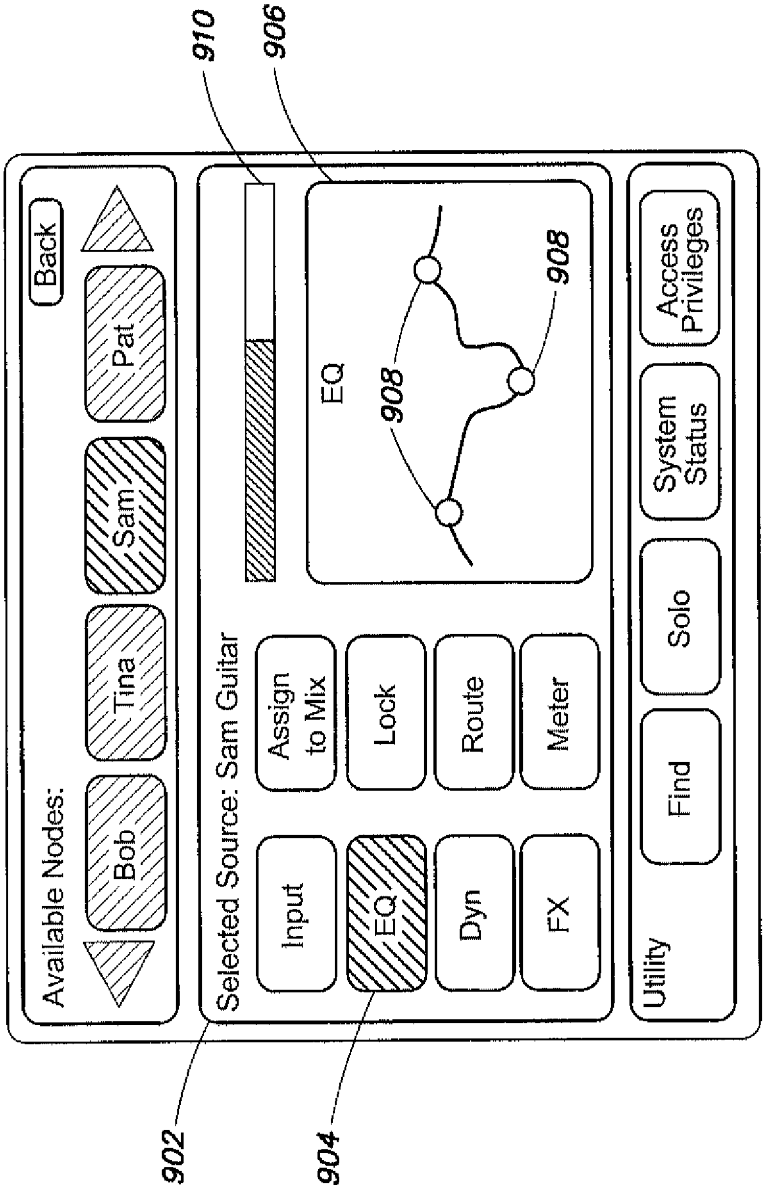
FIG. 9 is a diagrammatic screen shot of a source control screen of an illustrative user interface for controlling a distributed audio processing system.
Figure 10:
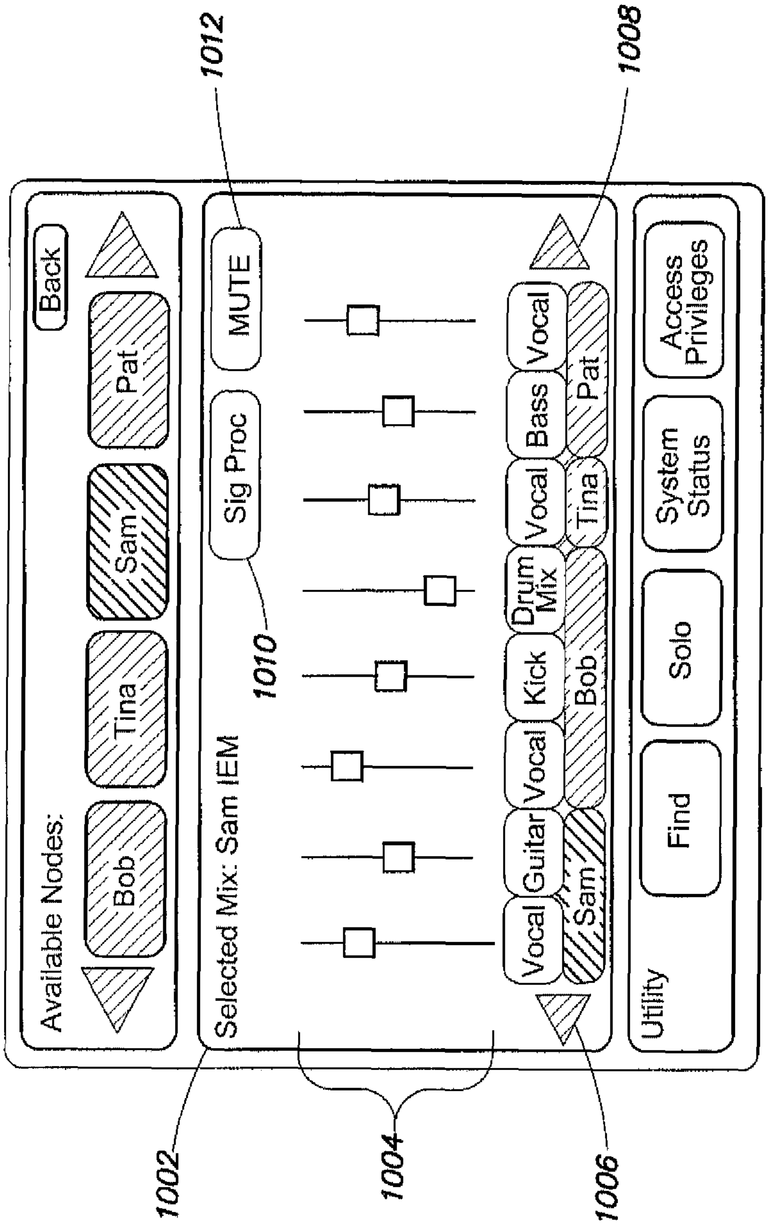
FIG. 10 is a diagrammatic screen shot of a mix control screen of an illustrative user interface for controlling a distributed audio processing system.

FIGS. 8, 9, and 10 illustrate an example of a user interface (UI) implemented on a touch screen to provide control over a DSSN mixer system comprising multiple end nodes. The user interface may run on a screen attached to any DSSN end node, or on a computer or mobile device connected directly to the network via a wired or wireless link.

FIG. 8 illustrates an example of a home screen in the UI. Panel 802 at the top of the screen allows a user to scroll through the various end nodes and select one to be controlled. Once an end node is selected, the user can use panel 804 to select a function he wishes to control. Primary functions are sources, having selection panel 806, and mixes, having selection panel 808. A utility panel 810 is included to allow users to perform operations that are not directly associated with a particular end node. For example, a user may wish to find a signal based on its name or other qualities, without blowing in which end node that signal resides. A user may wish to query the System Status to get information about the system as a whole, such as synchronization or network statistics. The UI may also include a means to view or set access privileges, which can be used to limit which functions can be controlled by which users on the network.

FIG. 9 is an illustration of a UI screen for controlling sources in a DSSN mixer system. In this example, source control panel 902 appears after the user selects a source from panel 806 in the home screen of FIG. 8. From the source control panel, the user can select the input function to control the functions of input channels in the system. In the illustration the equalization (EQ) function has been selected by "touch button" 904 and equalization curve 906 is displayed as a result, allowing the user to adjust the EQ settings using curve anchors 908. In addition to controlling signal conditioning and enhancement functions, the user may control other parameters related to the selected source, such as routing, metering options, assignments of the selected source to mix busses throughout the system (if access privileges permit doing so), or the user may lock the input channel to prohibit further modifications to settings once they are fine tuned. Additional touch buttons are shown in panel 902 to access these functions. Bar graph meter 910 displays signal amplitude of the source.

FIG. 10 is an illustration of a UI screen for controlling mixes in a DSSN mixer system. In this example, mix control panel 1002 appears after the user selects a mix from panel 808 in the home screen (FIG. 8). From the mix control panel, the user can make relative volume adjustments for all the sources in the selected mix using "touch sliders" 1004. Scroll buttons 1006 and 1008 allow a user to access a large number of sources as needed. Touch button 1010 provides access to signal processing functions available output channel assigned to the selected mix, such as EQ, dynamics, and the like. Mute button 1012 allows the user to mute or unmute the mix output. The mix control screen may include other mixing parameters such as panning or individual solo and mute controls for each source (not shown).

Other types of user interfaces may accomplish the same purpose, such as dedicated control panels with knobs, sliders, LEDs, character displays and the like, or graphical user interface (GUI) application software running on a computer workstation, or any combination of these types. The described UI illustrates a simple UI example; many other functions that users may wish to control within a DSSN architecture system may also be included. However, the example serves to show that the networked nature of a DSSN system allows multiple users to control any or all of the many functions within a multi-node DSSN mixer system, from any end node (DSSN or other) on the network.

The various components of a DSSN architecture-based end node may be implemented using various special purpose and/or customized processors, or by using general-purpose processors or by using a combination of these. Input processing, including the processing of multiple input channels, including channel strip signal block processing (FIG. 4, 412, 414) may be implemented by a digital signal processor (DSP), a general-purpose central processing unit (CPU) or a field-programmable gate array (FPGA), or a combination of these devices. Similarly, output processing (424, 426) may be implemented on another DSP, CPU, or FPGA, of a combination of these devices, which may be the same or different from the input processor(s). Mixer 418 may be implemented on a DSP, CPU, or FPGA which may be the same or different from the devices performing the input and output processing. In some embodiments, all of the input processing, output processing, and mixing may be implemented on a single device having a single processor, or a system-on-chip (SoC) device having multiple processors integrated within one device package. Input processing, output processing, and mixing are computational operations that may be mapped onto DSP, CPU, and/or FPGA devices in all manner of combinations and configurations, and as such neither the DSSN system architecture, nor devices that employ DSSN architecture, are dependent on a specific implementation or partitioning of functionality onto a specific type or number or combination of processing devices.

The various components of the system, including a host system within a given end node, may be implemented as an embedded computing system running embedded software or firmware to execute the operations of the end node and communicate with the one or more user interfaces operable by human users. An embedded computing system typically comprises a CPU having one or more cores, each core having the ability to fetch and execute binary microcode instructions. The system typically has nonvolatile storage for storing the microcode instructions and persistent data, and upon power up the CPU will boot (begin execution) by fetching instructions from nonvolatile storage. The system also has random-access memory (RAM) which is used for temporary storage of data and instructions while the device is operating. The embedded computing system further has communication means to interact with other system components operating inside the end node. Examples of other system components or functions include, but are not limited to, direct memory access (DMA) controllers, Ethernet controllers. Universal Serial Bus (USB) controllers, parallel busses in various formats including PCI and PCIe, Thunderbolt interface controllers, display drivers, separate audio processing devices such as DSPs, FPGAs, or special-function integrated circuits, serial ports including universal asynchronous receiver/transmitter (UART) ports, serial programmable interface (SPI) ports, and inter-integrated-circuit (I2C) ports.

The various components of the system, including a host system within each of the end nodes described herein may be implemented as a computer program using a general-purpose computer system. Such a computer system typically includes a main processor with locally attached memory, and it may or may not have locally attached means for user input and display output.

One or more output devices may be connected to the computer system. Example output devices include, but are not hunted to liquid crystal displays (LCD), plasma displays, various stereoscopic displays including displays requiring viewer glasses and glasses-free displays, cathode ray tubes, video projection systems and other video output devices, printers, devices for communicating over a low or high bandwidth network, including network interface devices, cable modems, and storage devices such as disk or tape. One or more input devices may be connected to the computer system. Example input devices include, but are not limited to a keyboard, keypad, track ball, mouse, pen and tablet, touchscreen, camera, communication device, and data input devices. The invention is not limited to the particular input or output devices used in combination with the computer system or to those described herein.

The computer system, whether it be an embedded or general-purpose computing system as described above, or a combination of these, may be programmable using a computer programming language, a scripting language or even assembly language. In a general-purpose computer system, the processor is typically a commercially available processor. The general-purpose computer also typically has an operating system, which controls the execution of other computer programs and provides scheduling, debugging, input/output control, accounting compilation, storage assignment, data management and memory management, and communication control and related services. The computer system may be connected to a local network and/or to a wide area network, such as the Internet. The connected network may transfer to and from the computer system program instructions for execution on the computer, media data such as video data, still image data, or audio data, metadata, review and approval information for a media composition, media annotations, and other data.

A memory system typically includes a computer readable medium. The medium may be volatile or non-volatile, writeable or nonwriteable, and/or rewriteable or not rewriteable. A memory system typically stores data in binary forum. Such data may define an application program to be executed by the microprocessor, or information stored on the disk to be processed by the application program. The invention is not limited to a particular memory system. Time-based media may be stored on and input from magnetic, optical, or solid state drives, which may include an array of local or network attached disks.

A system such as described herein may be implemented in software or hardware or firmware, or a combination of the three. The various elements of the system, either individually or in combination may be implemented as one or more computer program products in which computer program instructions are stored on a non-transitory computer readable medium for execution by a computer, or transferred to a computer system via a connected local area or wide area network. Various steps of a process may be performed by a computer executing such computer program instructions. The computer system may be a multiprocessor computer system or may include multiple computers connected over a computer network. The components described herein may be separate modules of a computer program, or may be separate computer programs, which may be operable on separate computers. The data produced by these components may be stored in a memory system or transmitted between computer systems.

The various functions within a DSSN-architecture end node may be implemented in either a physically modular manner, or a tightly integrated manner, or a hybrid of both. The usage of terminology such as “module” or “component” or “block” herein is merely for the purposes of describing various elements of an end node’s functionality. Terms such as “module” or “component” or “block” may not correspond to individual physical elements of the system, and the scope of the invention includes embodiments in which one or more modules or components or blocks may be tightly integrated within a common processing device, or a common circuit, or other common physical elements in the system. In various embodiments, one or more modules, components, or blocks may span more than one device, circuit, or other physical element in the system, and in this case the mapping of modules, components, or blocks onto these physical elements is not implied to be one-to-one.

Having now described an example embodiment, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. An audio processing unit comprising:
an audio input module for receiving one or more source audio signals;
an audio output module for outputting one or more audio mixes;
a network connection module configured to send and receive audio signals over a network in substantially real-time;
one or more input channels for processing the received one or more source audio signals, wherein each of the received source audio signals is processed by an assigned channel of the one or more input channels, and wherein each input channel includes a channel strip comprising a chain of processing blocks to be applied to the received source audio signal assigned to that channel, and wherein an output of each of the one or more input channels is directly transmitted over the network via the network connection module;
a digital mixer for generating one or more output mixes by mixing the processed source audio signals received from the one or more channel strips with audio signals received via the network connection module from outputs of one or more real-time audio devices connected to the network; and
one or more output channels for processing the one or more output mixes, wherein each of the one or more output mixes is processed by an assigned one of the one or more output channels, and wherein the audio output module is configured to receive and output the processed one or more output mixes.

2. The audio processing unit of claim 1, wherein the audio processing unit further includes a processor for hosting a user interface, and wherein the user interface enables an operator to control parameters of the one or more output mixes.

3. The audio processing unit of claim 2, wherein the network connection module comprises a network switch including a port connected to the processor for hosting a user interface, and at least two externally available ports for establishing connections to a plurality of devices on the network, and wherein the network switch is configured to filter and route packets between the network switch ports enabling the network switch to bridge between at least two externally connected network devices and the processor for hosting a user interface.

4. The audio processing unit of claim 3, wherein the at least two externally available ports support a daisy chain connection topology.

5. The audio processing unit of claim 1, wherein the network connection is further configured to receive over the network control commands for controlling parameters of at least one of the one or more input channels, the digital mixer, and the one or more output channels.

6. The audio processing unit of claim 5, wherein the control commands are transmitted over the network by a device connected to the network, and wherein the control commands are generated by interaction of an operator of the device with a user interface of the device.

7. The audio processing unit of claim 5, wherein the one or more processed output mixes are provided to the network connection module for transmission over the network, and wherein the operator of the device is able to listen to the one or more processed output mix while controlling the parameters of at least one of the input processor, digital mixer and the output processor.

8. The audio processing unit of claim 1, wherein a user interface for controlling the audio processing unit is hosted by a second audio processing unit connected to the network.

9. The audio processing unit of claim 1, wherein each of the input channels further comprises a second channel strip for processing the one or more received source audio signals, wherein the output of each of the second channel strips is provided to the digital mixer and to the network connection module for transmission over the network.

10. The audio processing unit of claim 9, wherein the outputs of the first-mentioned channel strips are suitable for feeding a local monitor mix and the outputs of the second set of channel strips are suitable for feeding a front of house mix.

11. The audio processing unit of claim 1, wherein an output of the digital mixer is provided to the network connection module for transmission over the network.

12. The audio processing unit of claim 1, wherein each of the one or more output channels includes an output channel strip, and wherein an output of at least one of the output channel strips is provided to the network connection module for transmission over the network.

13. The audio processing unit of claim 1, wherein the channel strip processing of the received audio signals includes a rumble filter.

14. The audio processing unit of claim 1, wherein the channel strip processing of the received audio signals includes equalization.

15. The audio processing unit of claim 1, wherein the channel strip processing of the received audio signals includes at least one of delay, and insert processing.

16. The audio processing unit of claim 1, wherein the network connection module is further configured to receive pre-mixed audio signals over the network, and wherein the digital mixer is further able to generate an output mix that includes the pre-mixed audio signals.

17. The audio processing unit of claim 1, wherein the digital mixer is configured to generate one or more output mixes in addition to the first-mentioned output mix, and further comprising one or more output processors in addition to the first-mentioned output processor, wherein each of the first mentioned output mix and the one or more additional output mixes is processed by an assigned one of the first mentioned output processor and additional one or more output processors to generate a processed output mix for sending to the audio output module.

18. The audio processing unit of claim 1 further comprising an analog mixer for receiving one or more of the source audio signals in analog form and for mixing the one or more received audio signals in analog form with one or more submixes of signals received from the network via the network connection module, wherein an output of the analog mixer is received for output by the audio output module, such that an audio path latency for the one or more signals received in analog form between receipt by the audio input module and output by the audio output module is less than about 50 microseconds.

19. An audio processing system comprising:
a plurality of end nodes connected by a network, wherein each of the end nodes is configured to send and receive audio signals over the network in substantially real-time, each end node including:
one or more audio input ports;
one or more audio output ports;
an input processing module;

a mixing module; and an output processing module for processing a mix received from the mixing module;

wherein a first end node of the plurality of end nodes is configured to:

receive first audio signals via the one or more audio input ports of the first end node;

condition the first audio signals using the input processing module of the first end node; and directly transmit the conditioned first audio signals over the network; and wherein a second end node of the plurality of end nodes is configured to:

receive the conditioned first audio signals via the network;

receive additional conditioned audio signals from one or more end nodes of the plurality of end nodes other than the first and second end nodes;

mix the conditioned first audio signals and the additional conditioned signals using the mixing module of the second end node to generate an output mix;

process the output mix using the output processing module of the second end node; and output the one or more rendered output mixes from the one or more audio output ports of the second module.

20. The audio processing system of claim 19, wherein configuring the first and second end nodes to send and receive audio signals over the network in substantially real-time corresponds to a signal transport latency in the network that is approximately equal to an acoustic path latency between a physical location of the first node and a physical location of the second node.

21. The audio processing system of claim 19, wherein the second end node is further configured to:

receive second audio signals via the one or more audio input ports of the second end node;

condition the second audio signals using the input processing module of the second end node; and include the conditioned second audio signals as one or more inputs to the mixing module of the second end node to generate an output mix that includes the conditioned second audio signals.

22. The audio processing system of claim 19, wherein one or more of the plurality of end nodes each further includes a second input processing module, and wherein, for each of the one or more of the plurality of end nodes further including a second input processing module:

the first mentioned input processing module is configured to condition the audio signals received from the one or more audio input ports of that end node for a front of house mix; and the second input processing module is configured to condition the audio signals received from the one or more audio input ports of that end node for a monitor mix local to that end node.

23. The audio processing system of claim 19, wherein conditioning the first audio signals includes at least one of rumble filtering, equalization, delaying, and insert processing.

24. The audio processing system of claim 19, wherein rendering the output mix includes at least one of adding reverb effects and equalization, and wherein the rendering is adapted to an output environment associated with the second end node.

25. The audio processing system of claim 19, further comprising one or more additional end nodes in addition to the first-mentioned plurality of end nodes, wherein each of the one or more additional end nodes is connected to the network, and wherein the one or more additional end nodes include at least one of a video camera, a digital audio workstation, a mixer control panel, a mobile controller, a video display, and media server.

26. An audio processing system comprising:

a plurality of end nodes connected by a network, wherein each of the end nodes is configured to send and receive audio signals over the network in substantially real-time, each end node including:

one or more audio input ports;

one or more audio output ports;

an audio processing module for processing audio signals received via the one or more audio input ports; and a mixing module for mixing audio signals; and wherein the system is configured to:

at a first end node of the plurality of end nodes:

bypassing the mixing module, directly transmit an output of the audio processing unit over the network;

receive a command via a user interface local to the first end node, wherein the command is one of an audio processing command and a mixing command; and transmit the command across the network; and at a second end node of the plurality of end nodes:

receive the output of the audio processing unit of the first end node;

receive the command; and execute the command on the second end node.

* * * * *